United States Patent
Kamiyama et al.

(10) Patent No.: US 7,101,753 B2
(45) Date of Patent: Sep. 5, 2006

(54) METHOD FOR MANUFACTURING A SEMICONDUCTOR DEVICE AND METHOD FOR FORMING HIGH-DIELECTRIC-CONSTANT FILM

(75) Inventors: Satoshi Kamiyama, Ibaraki (JP); Tsunetoshi Arikado, Ibaraki (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/811,979

(22) Filed: Mar. 30, 2004

(65) Prior Publication Data

US 2005/0139937 A1 Jun. 30, 2005

(30) Foreign Application Priority Data

Dec. 26, 2003 (JP) ............................. 2003-434367

(51) Int. Cl.
*H01L 21/8242* (2006.01)

(52) U.S. Cl. ...................... 438/240; 438/197

(58) Field of Classification Search ............... 438/197, 438/240
See application file for complete search history.

(56) References Cited

U.S. PATENT DOCUMENTS

| | | | |
|---|---|---|---|
| 5,705,224 A | 1/1998 | Murota et al. | |
| 6,013,553 A | 1/2000 | Wallace et al. | |
| 6,020,243 A | 2/2000 | Wallace et al. | |
| 6,544,906 B1 | 4/2003 | Rotondaro et al. | |
| 6,548,424 B1 | 4/2003 | Putkonen | |
| 6,642,131 B1 | 11/2003 | Harada | |
| 2003/0218223 A1 | 11/2003 | Nishiyama et al. | |
| 2004/0169240 A1* | 9/2004 | Koyama et al. | ............. 257/411 |
| 2005/0110091 A1* | 5/2005 | Yamazaki et al. | ........... 257/347 |
| 2005/0167768 A1* | 8/2005 | Yamaguchi | ................. 257/410 |

FOREIGN PATENT DOCUMENTS

| | | |
|---|---|---|
| EP | 1 363 333 | 11/2003 |
| JP | 2002-343790 | 11/2002 |
| JP | 2003-008011 | 1/2003 |

OTHER PUBLICATIONS

Vainonen-Ahlgren, E., et al.; "Atomic layer deposition of hafnium and zirconium silicate thin films", *Computational Materials Science*, vol. 27, No. 1-2, pp. 65-69, (Mar. 2003).

Hu, H. et al.; "MIM Capacitors Using Atomic-Layer-Deposited High-K $(HfO_2)_{1-x}(Al_2O_3)_x$ Dielectrics", *IEEE Electron Device Letters*, vol. 24, No. 2, pp. 60-62, (Feb. 2003).

Hobbs, C. et al.; "Fermi Level Pinning at the PolySi/Metal Oxide Interface", *2003 Symposium of VLSI Tech. Digest of Technical Papers*, pp. 3-4.

* cited by examiner

*Primary Examiner*—Long Pham
(74) *Attorney, Agent, or Firm*—Leydig, Voit & Mayer, Ltd.

(57) ABSTRACT

A semiconductor device having a gate electrode on a silicon substrate via a gate insulating film is formed by laminating the gate insulating film with a silicon oxide film, formed on the silicon substrate, an Hf silicate film is formed on the silicon oxide film, and a nitrogen-containing Hf silicate film formed on the Hf silicate film, and containing Hf in a peak concentration in a range from one atomic % to thirty atomic %, and nitrogen in a peak concentration in a range from ten atomic % to thirty atomic %.

12 Claims, 12 Drawing Sheets

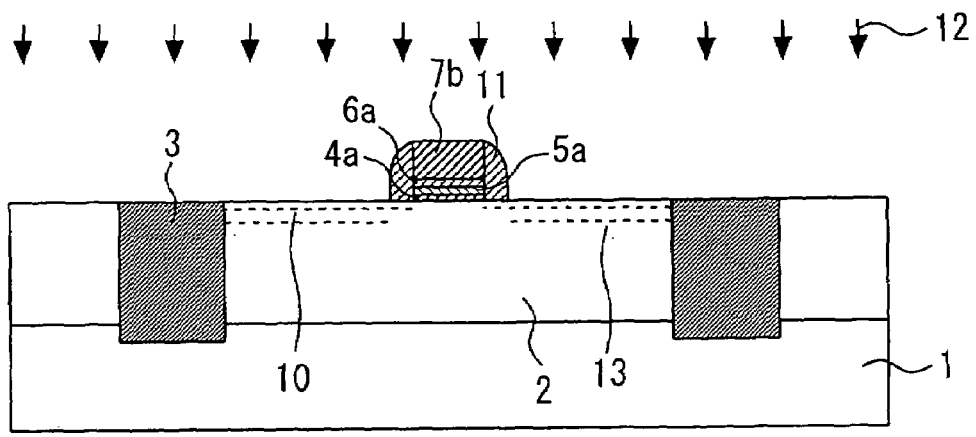
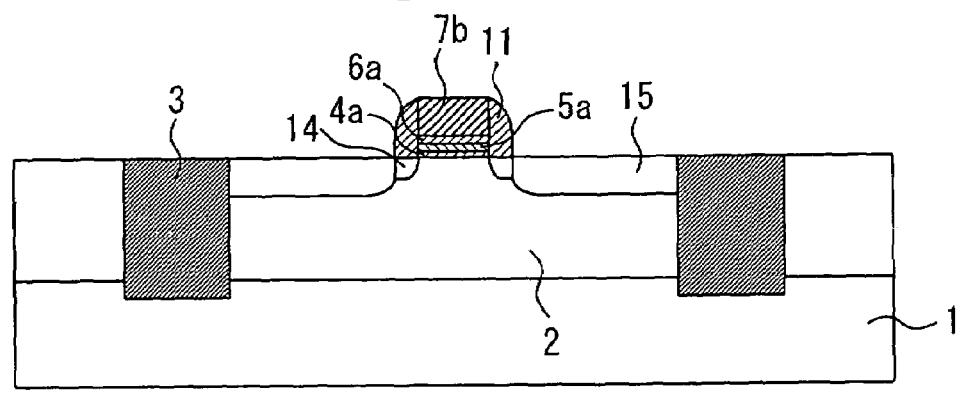
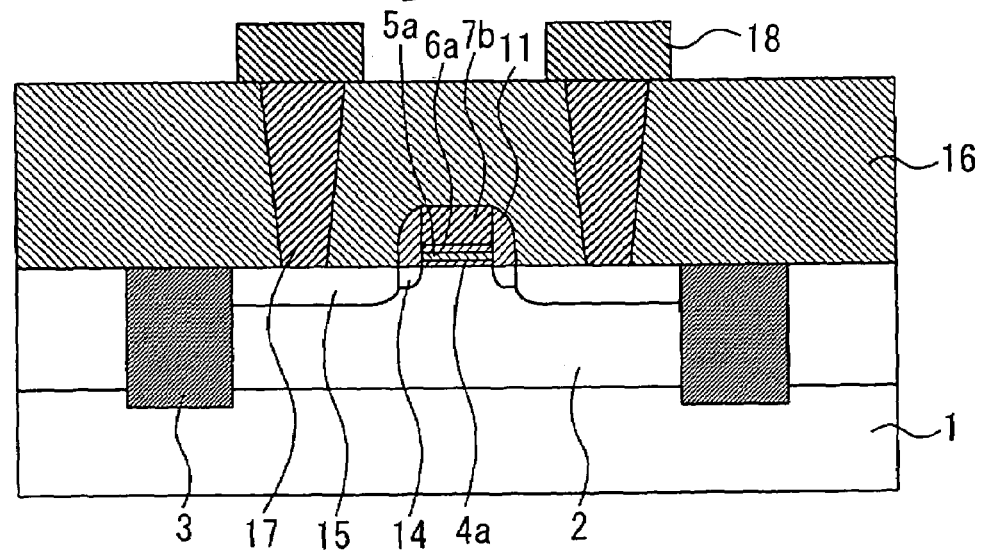

METHOD FOR MANUFACTURING A SEMICONDUCTOR DEVICE AND METHOD FOR FORMING HIGH-DIELECTRIC-CONSTANT FILM

BACKGROUND OF THE INVENTION

1. Field of the Invention

The present invention relates to a semiconductor device using a metal silicate film as a gate insulating film, to a method for manufacturing such a semiconductor device, to an apparatus for forming such a film in a semiconductor device, and to a method for forming such a high-dielectric-constant film in a semiconductor device.

2. Background Art

Accompanying the miniaturization of semiconductor devices, the reduction of thickness of gate insulating films has been demanded. The reduction of thickness of silicon oxide films and silicon oxynitride films (hereafter referred to as "silicon oxide film and the like"), which are used as conventional gate insulating films, is limited due to increase in leak current, and it is difficult to reduce the $SiO_2$-converted film thickness to 1.5 nm or less. Therefore, there has been proposed a method for inhibiting leak current by using a high-dielectric-constant film, such as a metal oxide film, a metal silicate film and a metal aluminate film, which has a higher specific inductive capacity higher than that of silicon oxide film and the like as the gate insulating film; and by increasing the physical film thickness of the gate insulating film.

However, when the high-dielectric-constant film is used as the gate insulating film, and a polysilicon electrode is used as the gate electrode, there has been a problem that impurities doped in the polysilicon electrode diffuse into the substrate through the gate insulating film when the impurities are activated, and the transistor properties are deteriorated.

In order to solve this problem, a method for introducing nitrogen into the high-dielectric-constant film has been proposed.

Specifically, there has been proposed method for forming a high-dielectric constant film composed of a zirconium oxynitride layer or a hafnium oxynitride layer, by forming a metal layer composed of zirconium or hafnium on a substrate, and oxynitriding the metal layer (refer to e.g., Japanese Patent Laid-Open No. 2000-58832).

Furthermore, there has also been proposed a method for laminating a lower barrier film consisting of a hafnium-containing silicon oxynitride film, a high-dielectric-constant film consisting of a silicon-containing hafnium oxide film, and an upper barrier film consisting of a silicon-containing hafnium oxide film that contains nitrogen to form a gate insulating film and for controlling the composition of a metal (M), oxygen (O), nitrogen (N) and silicon (Si) in the high-dielectric-constant film and the lower barrier film (refer to e.g., Japanese Patent Laid-Open No. 2003-8011).

In a thin-film formation using a high-dielectric-constant material, the ALD (atomic layer deposition) method is generally used. In this method, material gasses are alternately supplied while resetting the chamber to the original state to form each atomic layer.

For example, the formation of a hafnium oxide ($HfO_2$) film as a high-dielectric-constant film will be specifically described. First, the chamber is evacuated, argon gas is flowed in the chamber, and the pressure in the chamber is maintained to 0.2 Torr. In this state, hafnium tetramethyl-ethylamide [$Hf(N(CH_3)(C_2H_5)_2)_4$] is flowed into the chamber while controlling the flow rate, and the Hf material is vaporized and adsorbed on the surface of the substrate. Then, the chamber is purged, and an oxidizing gas such as ozone gas is introduced. Thereafter, the chamber is purged. By repeating such steps for several tens of times, a hafnium oxide ($HfO_2$) film of a thickness of several nanometers can be formed on the surface of the substrate.

The introduction of nitrogen into a high-dielectric-constant film reduces flat-band-voltage shift (hereafter referred to as "Vfb shift") due to the diffusion of impurities. This is estimated because the high-dielectric-constant gate insulating film is densified by nitriding treatment, and the diffusion of impurities is restricted.

However, in the above-described conventional method, initial Vfb shift due to the effect of fixed charge or the like is large, and there has been a problem that satisfactory transistor characteristics cannot obtained particularly in P-channel MIS transistors.

In addition, a high-dielectric-constant thin film formed using the ALD method generally contains several percent impurities. This is considered because carbon (C), hydrogen (H) or chlorine (Cl) included in material gas using the ALD method remains and is incorporated in the formed film. The impurities remaining in the high-dielectric-constant film may cause fixed charge and trap, and the characteristics of the film is damaged.

SUMMARY OF THE INVENTION

The one object of the present invention is to restrict initial Vfb shift, to form a gate insulating film having high film quantity, and to achieve satisfactory transistor characteristics.

Another object of the present invention is to lower the impurity content in the high-dielectric-constant film of the gate insulating film.

According to one aspect of the present invention, a semiconductor device comprises a substrate, a gate insulating film and a gate electrode. The gate insulating film is formed on the substrate, and has a nitrogen-containing metal silicate film or a nitrogen-containing metal aluminate film that contains a metal in a peak concentration of 1 atomic % or more and 30 atomic % or less on the uppermost layer. The gate electrode is formed on the gate insulating film.

Another aspect of the present invention, a semiconductor device comprises a substrate, a gate insulating film, and a gate electrode. The gate insulating film is formed on the substrate and has a base interface layer, a metal silicate film and a nitrogen-containing metal silicate film. The base interface layer is formed on the substrate. The metal silicate film is formed on the base interface layer, and contains a metal, oxygen and silicon. The nitrogen-containing metal silicate film contains a metal in a peak concentration of 1 atomic % or more and 30 atomic % or less, oxygen, silicon, and nitrogen. The gate electrode formed on the gate insulating film.

Another aspect of the present invention, in method for manufacturing a semiconductor device, a base interface layer is formed on a substrate. A metal silicate film containing a metal in a peak concentration of 1 atomic % or more and 30 atomic % or less is formed on the base interface layer. A nitrogen-containing metal silicate film containing nitrogen in a peak concentration of 10 atomic % or more and 30 atomic % or less is formed on the upper layer of the metal silicate film. A gate electrode is formed on the nitrogen-containing metal silicate film.

Another aspect of the present invention, in method for manufacturing a semiconductor device, a base interface layer is formed on a substrate. A metal silicate film containing a metal in a peak concentration of 5 atomic % or more and 40 atomic % or less is formed on the base interface layer. A nitrogen-containing metal silicate film containing a metal in a peak concentration of 1 atomic % or more and 30 atomic % or less and nitrogen in a peak concentration of 10 atomic % or more and 30 atomic % or less is formed on the metal silicate film. A gate electrode is formed on the nitrogen-containing metal silicate film.

Another aspect of the present invention, a apparatus for forming a film comprises a housing, a table installed in the housing, for placing a substrate, a gas supply port for supplying a gas into the housing, a gas discharge port for discharging the gas in the housing out of the housing, and a heater. The heater is for heating the surface of the substrate by radiating light on the surface of the substrate placed on the table for a time up to several milliseconds.

Another aspect of the present invention, in a method for forming a high-dielectric-constant film on a substrate, a first material gas that contains at least one element in elements constituting the high-dielectric-constant film is supplied into a housing wherein the substrate is placed. A second material gas that reacts with the first material gas and forms the high-dielectric-constant film is supplied into the housing. The surface of the substrate is heated by radiating light onto the surface of the substrate for a time up to several milliseconds.

Other and further objects, features and advantages of the invention will appear more fully from the following description.

BRIEF DESCRIPTION OF THE DRAWINGS

FIGS. 8A to 10C are sectional views for illustrating the process for manufacturing a semiconductor device in the first embodiment of the present invention;

DETAILED DESCRIPTION OF THE PREFERRED EMBODIMENTS

Figure 1:
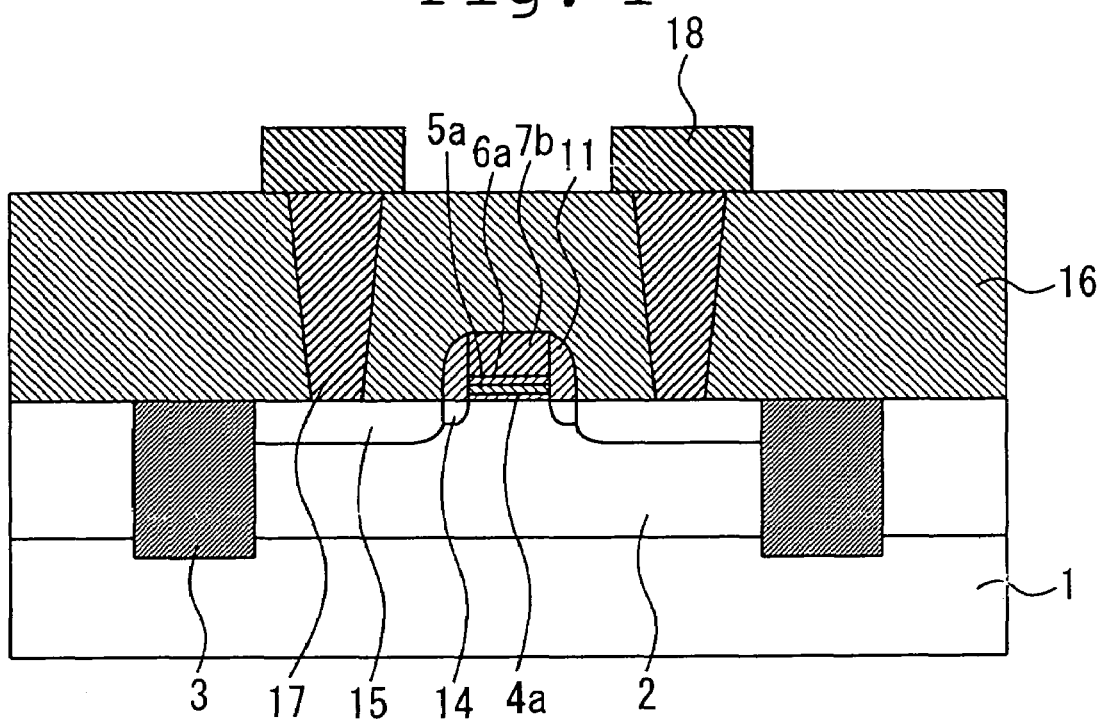
FIG. 1 is a sectional view for illustrating a semiconductor device in the first embodiment of the present invention.

The embodiment of the present invention will be described referring to the drawings. In each of the drawings, the same or like parts will be denoted with the same reference numerals, and the description thereof will be simplified or omitted.

First Embodiment

FIG. 1 is a sectional view for illustrating a semiconductor device according to the first embodiment of the present invention. Specifically, FIG. 1 is a sectional view for illustrating a P-channel MOS transistor (hereafter referred to as "PMOS transistor").

In the PMOS, a substrate 1 is a p-type silicon substrate. As FIG. 1 shows, an n-type well 2 to which an n-type impurity is introduced is formed in the substrate 1. An element-isolating structure 3 is formed on the element-isolating region of the substrate 1. By the element-isolating structure 3, a PMOS transistor-forming region, which is an active region, is partitioned. The element-isolating structure 3 is an STI (shallow trench isolation) formed by filling a shallow trench formed from the surface side of the substrate 1 with a silicon oxide film. On the substrate 1 of the MOS transistor-forming region, gate insulating films 4a, 5a and 6a are laminated and a gate electrode 7b is formed through the gate insulating films 4a, 5a and 6a.

The gate insulating film has a base interface layer 4a formed on the substrate 1, a high-dielectric-constant film 5a formed on the base interface layer 4a, and an upper layer insulating film 6a formed on the high-dielectric-constant film 5a. The base interface layer 4a is silicon oxide film for repressing the reaction at the interface. The thickness of the base interface layer 4a is preferably 1 nm or below, for example, about 0.5 nm.

The high-dielectric-constant film 5a is a metal silicate film that contains a metal, oxygen and silicon, and for example, an Hf (hafnium) silicate film or a Zr (zirconium) silicate film can be used. The thickness of the high-dielectric-constant film 5a is, for example, about 3 nm.

The upper layer insulating film 6a is a nitrogen-containing metal silicate film that contains a metal, oxygen, silicon and nitrogen, and for example, a nitrogen-containing Hf silicate film or a nitrogen-containing Zr silicate film can be used.

The upper layer insulating film 6a is a film containing a metal such as Hf and Zr in a peak concentration of 1 atomic % or more and 30 atomic % or less. That is, the nitrogen-containing metal silicate film 6a is a silicon-rich film. This is because if the peak concentration of the metal exceeds 30 atomic %, satisfactory electrical properties cannot be obtained as described later.

The upper layer insulating film 6a also contains nitrogen in a peak concentration of 10 atomic % or more and 30 atomic % or less. This is because if the peak concentration of nitrogen is less than 10 atomic %, the densification of the upper layer insulating film 6a becomes insufficient, and in the activating heat treatment, the inhibition of the diffusion of impurities such as phosphorus and boron introduced into polysilicon, which is the gate electrode, becomes difficult to control. It is practically impossible to make the peak concentration of nitrogen exceed 30 atomic %, and even if it is possible, excellent electrical properties cannot be obtained.

The thickness of the upper layer insulating film 6a is preferably about 1/20 to 2/3 the thickness of the high-dielectric-constant film 5a.

The gate electrode 7b is a polysilicon electrode consisting of a doped silicon film formed by introducing an impurity into a polysilicon film. The polysilicon electrode can be substituted by a silicon-germanium ($Si_xGe_y$) can be used as the gate electrode 7b.

On the sides of the gate electrode 7b, and gate insulating films 4a, 5a and 6a, a sidewall 11 is formed as a spacer for forming LDD. The sidewall 11 consists of a silicon oxide film or a silicon nitride film.

Across the channel region on the surface of the substrate 1 below the gate electrode 7b, an extension region 14 of lower concentration is formed by introducing a p-type impurity. A source-drain region 15 of higher concentration is formed by introducing a p-type impurity on the n-type well 2 so as to connect to the extension region 14.

An interlayer insulating film 16, such as BPSG, BSG and PSG, is formed so as to coat the gate electrode 7b. In the interlayer insulating film 16, contact hole connected to the source-drain region 15 are formed, and in the contact holes, contacts 17, in which conductive films such as a laminated films of barrier metal films and tungsten films are buried, are formed. Metal wirings 18 are formed on the contacts 17.

The present invention can be applied not only to the above-described PMOS transistor, but also to an N-type channel MOS transistor (here after referred to as "NMOS transistor") having the same cross-sectional structure.

In the case of an NMOS transistor, a p-type well is formed in a p-type substrate 1, and an NMOS transistor-forming region is partitioned by an element isolating structure 3. Furthermore, in the p-type well, an extension region of a lower concentration formed by introducing an n-type impurity, and a source-drain region of a higher concentration formed by introducing an n-type impurity and connected to the extension are formed.

Figure 2:
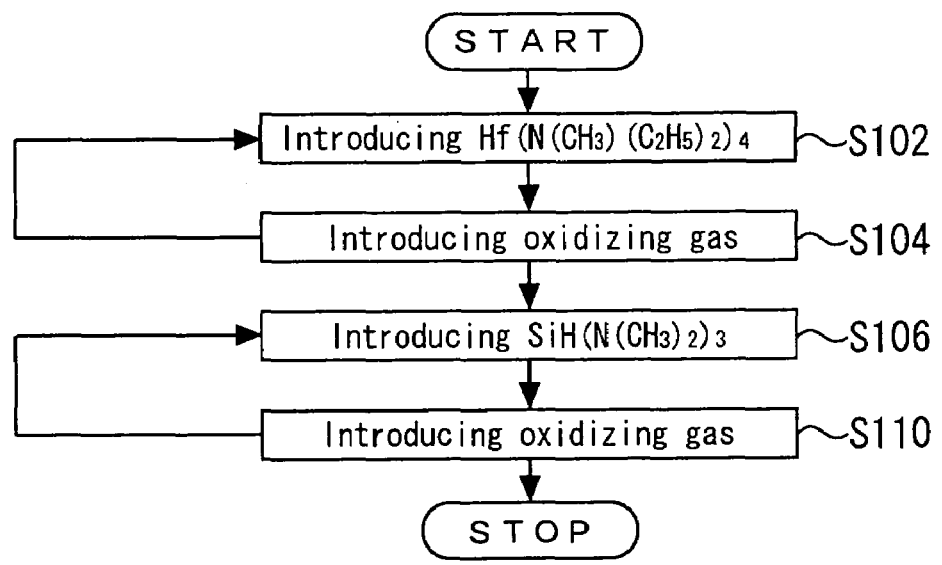
FIG. 2 is a flow diagram for illustrating a method for forming a metal silicate film in the first embodiment of the present invention.

FIG. 2 is a flow diagram for illustrating a method for forming a metal silicate film in the second embodiment of the present invention.

The method for forming a metal silicate film as the above-described high-dielectric-constant film 5 will be described below referring to FIG. 2. Specifically, a method for forming an Hf silicate film will be described.

The Hf silicate film is formed by the combination of a step for forming a hafnium oxide film ($HfO_2$ film) using the ALD (atomic layer deposition) method, and a step for forming a silicon-oxide film ($SiO_2$ film.) using the ALD method, and by controlling the number of each step.

The details of each step will be described below.

First, the step for forming a hafnium oxide film will be described.

The hafnium oxide film is formed by controlling the flow rate of hafnium tetramethylethylamide [$Hf(N(CH_3)(C_2H_5)_2)_4$] as an Hf material using a mass flow controller, gasifying the flow-rate-controlled Hf material, adsorbing the gasified Hf material on the surface of a silicon substrate held in a film-forming chamber (Step S102), and then introducing an oxidizing gas such as ozone gas into the chamber (Step S104). The above steps for forming the hafnium oxide film are made one cycle.

Figure 3:
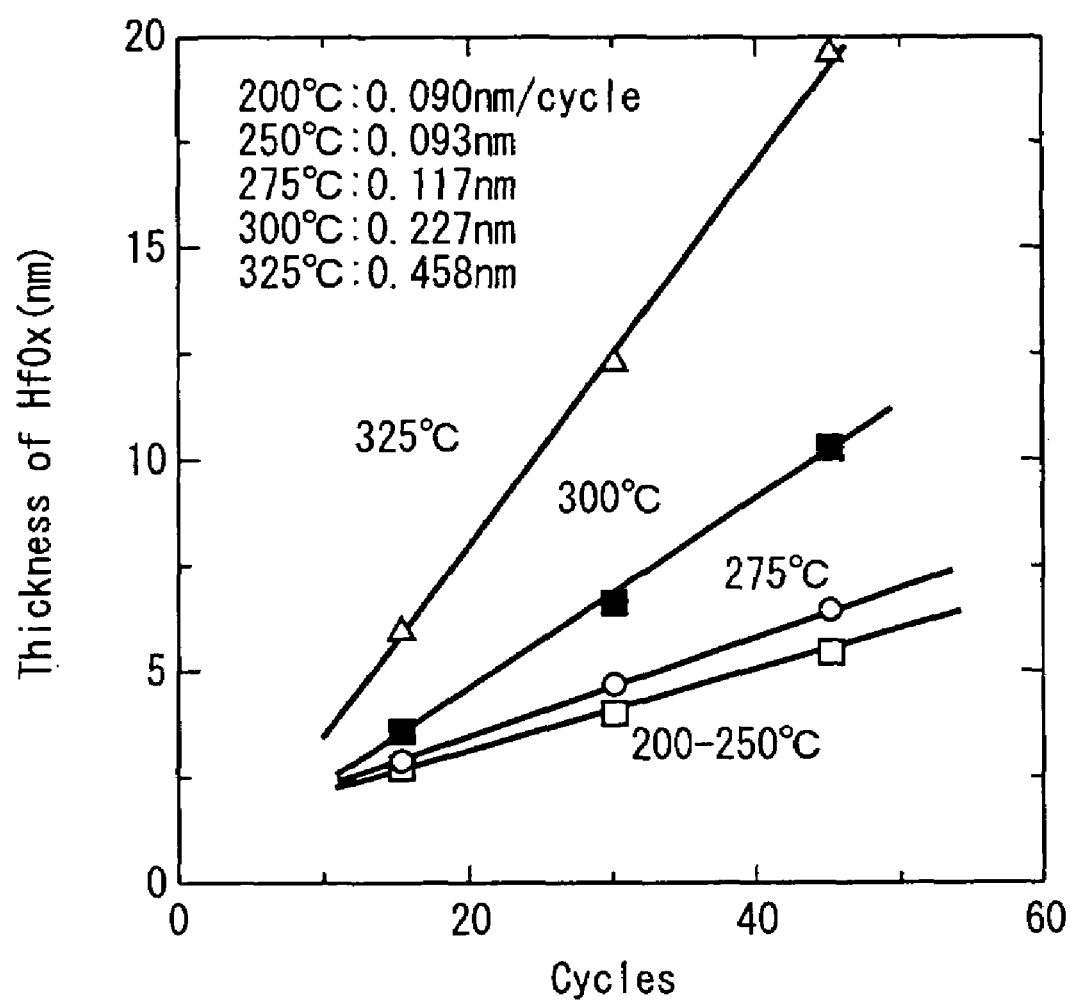
FIG. 3 is a graph showing the relationship between the number of cycles and the thickness of the hafnium oxide film when the hafnium oxide film is formed using tetramethylethylamide as an Hf material.

FIG. 3 is a graph showing the relationship between the number of cycles and the thickness of the hafnium oxide film when the hafnium oxide film is formed using tetramethylethylamide [$Hf(N(CH_3)(C_2H_5)_2)_4$] as an Hf material. FIG. 3 shows change in film thickness when the substrate temperature is 200° C., 275° C., 300° C. and 325° C.

As FIG. 3 shows, the thickness of the hafnium oxide film increases linearly with increase in the number of cycles at each temperature of the silicon wafer. Furthermore, with the rise of substrate temperature, the gradient of the straight line increases, and the film-forming speed per cycle increases.

This is considered because the quantity of tetramethylethylamide [$Hf(N(CH_3)(C_2H_5)_2)_4$] adsorbed on the surface of the substrate increases with the rise of substrate temperature.

As FIG. 3 shows, the speed of $HfO_2$ film formation per cycle at each substrate temperature was 0.090 nm/cycle at 200° C., 0.093 nm/cycle at 250° C., 0.117 nm/cycle at 275° C., 0.227 nm/cycle at 300° C., and 0.458 nm/cycle at 325° C.

As an Hf material, hafnium tetradimethylamide [$Hf(N(CH_3)_2)_4$] or hafnium tetradiethylamide [$Hf(N(C_2H_5)_2)_4$] can be used.

In place of an Hf silicate film, a Zr silicate film can be formed. In this case, as a Zr material, zirconium tetramethylethylamide [$Zr(N(CH_3)(C_2H_5)_2)_4$], zirconium tetradimethylamide [$Zr(N(CH_3)_2)_4$] or zirconium tetradiethylamide [$Zr(N(C_2H_5)_2)_4$] can be used.

As a metal, tantalum (Ta), scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), ytterbium (Yb), and lutetium (Lu) other than Hf or Zr can be used. In these cases, materials wherein the hafnium in the above Hf materials is substituted by each metal element can be used.

Next, the step for forming a silicon oxide film will be described.

The silicon oxide film is formed by controlling the flow rate of tris(dimethylamino)silane [$SiH(N(CH_3)_2)_3$] as an Si material using a mass flow controller, gasifying the flow-rate-controlled Si material, adsorbing the gasified Si material on the surface of a silicon substrate held in a film-forming chamber (Step S106), and then introducing an oxidizing gas such as ozone gas into the chamber (Step S108). The above steps for forming the silicon oxide film are made one cycle.

Figure 4A:
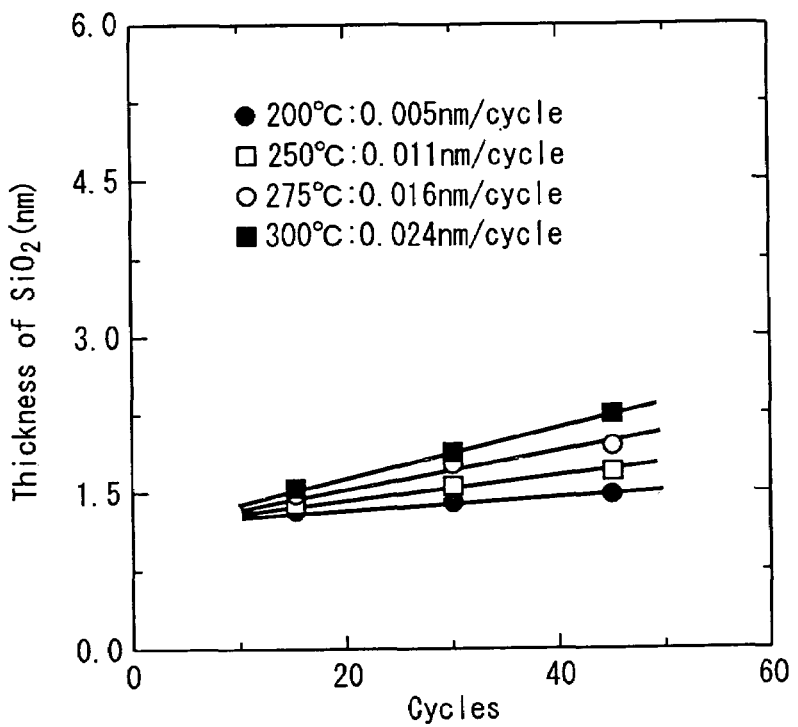
FIGS. 4A and 4B are graphs showing the relationship between the number of cycles and the thickness of the silicon oxide film when the silicon oxide film is formed using tris(dimethylamino)silane [SiH(N(CH$_3$)$_2$)$_3$] as an Si material.
Figure 4B:
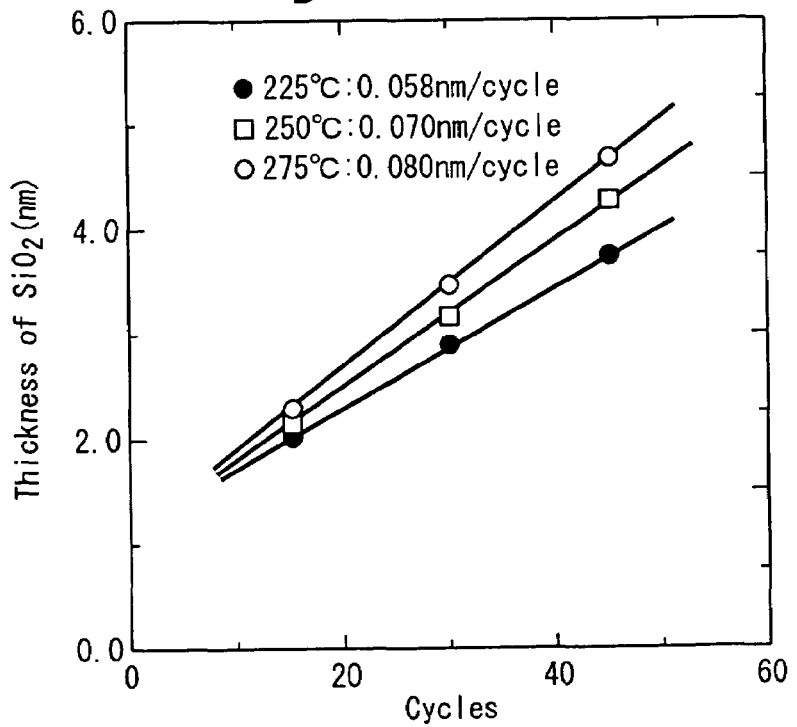

FIG. 4 is a graph showing the relationship between the number of cycles and the thickness of the silicon oxide film when the silicon oxide film is formed using tris(dimethylamino)silane [$SiH(N(CH_3)_2)_3$] as an Si material. FIG. 4A shows the results when the pressure in the film-forming chamber is 0.5 Torr; and FIG. 4B shows the results when the pressure in the film-forming chamber is 5.0 Torr.

When the pressure in the film-forming chamber is 0.5 Torr, as FIG. 4A shows, although the thickness of a silicon oxide film linearly increased with increase in the number of cycles, the film-forming speed was low. On the other hand, when the pressure in the film-forming chamber is raised to 5.0 Torr, as FIG. 4B shows, the film-forming speed increased largely.

This is considered because tris(dimethylamino)silane [SiH(N(CH$_3$)$_2$)$_3$], which is an Si material, is difficult to adsorb on the surface of the substrate at a pressure as low as 0.5 Torr, and the quantity of adsorption increases by raising the pressure to 5.0 Torr.

As FIG. 4B shows, when the film was formed under a low pressure of 0.5 Torr, the speed of forming the SiO$_2$ film per cycle at each substrate temperature was 0.058 nm/cycle at 225° C., 0.070 nm/cycle at 250° C., and 0.080 nm/cycle at 275° C.

As an Si material, tris(dimethylamino)silane [SiH(N(CH$_3$)$_2$)$_3$], tetrakis(dimethylamino)silane [SiH(N(CH$_3$)$_2$)$_4$], tetrakis(diethylamino)silane [SiH(N(C$_2$H$_5$)$_2$)$_4$], dimethylsilane [SiH$_2$(CH$_3$)$_2$], diethylsilane [SiH$_2$(C$_2$H$_5$)$_2$], or bis-tert-butylaminosilane [SiH$_2$(NH(C$_4$H$_9$)$_2$) can be used.

Figure 5:
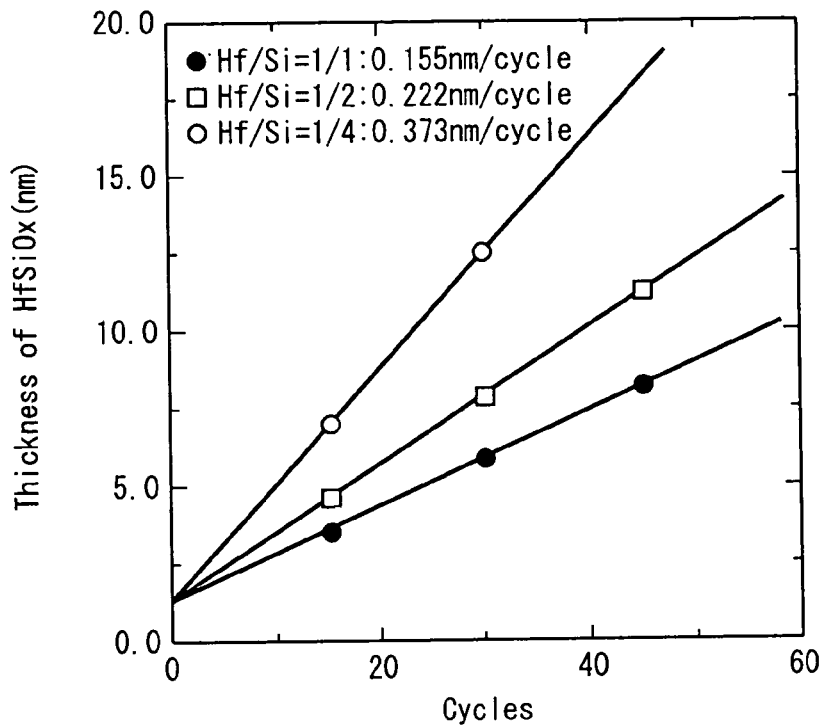
FIG. 5 is a graph showing the relationship between the number of cycles and the thickness of the Hf silicate film when a hafnium oxide film is formed using hafnium tetramethylethylamide [Hf(N(CH$_3$)(C$_2$H$_5$)$_2$)$_4$] as a Hf material, and a silicon oxide film is formed using tris(dimethylamino)silane [SiH(N(CH$_3$)$_2$)$_3$] as a Si material.

FIG. 5 is a graph showing the relationship between the number of cycles and the thickness of the Hf silicate film when a hafnium oxide (HfO$_2$) film is formed using hafnium tetramethylethylamide [Hf(N(CH$_3$)(C$_2$H$_5$)$_2$)$_4$] as a Hf material, and a silicon oxide (SiO$_2$) film is formed using tris(dimethylamino)silane [SiH(N(CH$_3$)$_2$)$_3$] as a Si material. The formation of the hafnium oxide film and the silicon oxide film is as described above.

In FIG. 5, Hf/Si=1/1 means that HfO$_2$ film formation and SiO$_2$ film formation are performed in every other cycle in a cycle of the step for forming the Hf silicate film. Hf/Si=1/2 means that after HfO$_2$ film formation has been performed once, SiO$_2$ film formation is performed twice; and Hf/Si=1/4 means that after HfO$_2$ film formation has been performed once, SiO$_2$ film formation is performed four times. In either cycle ratio, the pressure in the film-forming chamber in HfO$_2$ film formation was 0.5 Torr, and the pressure in the film-forming chamber in SiO$_2$ film formation was 5.0 Torr. The substrate temperature was 275° C.

As FIG. 5 shows, in either Hf/Si=1/1, Hf/Si=1/2 or Hf/Si=1/4, the thickness of the Hf silicate film was linearly increased with increase in the number of cycles. This means that the thickness of the Hf silicate film can be controlled very accurately by controlling the number of cycles. The speed of forming the Hf silicate film per cycle was 0.155 nm/cycle when Hf/Si=1/1, 0.222 nm/cycle when Hf/Si=1/2, and 0.373 nm/cycle when Hf/Si=1/4 as shown in FIG. 5.

Hf materials and Si materials can be duly changed to the above-described other materials.

Figure 6:
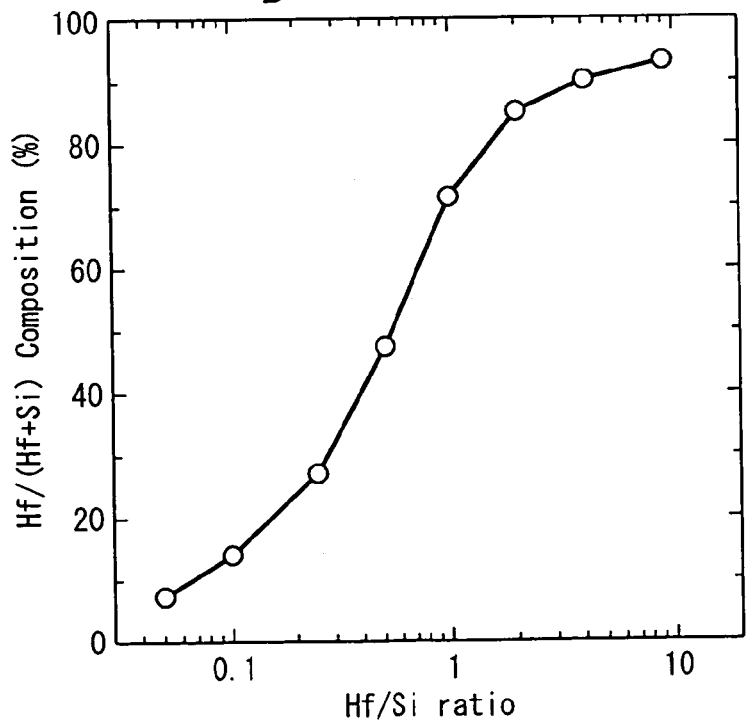
FIG. 6 is a graph showing the relationship between the Hf/Si ratio and the Hf content in the Hf silicate film [Hf/(Hf+Si)] in the case wherein a hafnium oxide film is formed using hafnium tetramethylethylamide [Hf(N(CH$_3$)(C$_2$H$_5$)$_2$)$_4$] as a Hf material and a silicon oxide film is formed using tris(dimethylamino)silane [SiH(N(CH$_3$)$_2$)$_3$] as a Si material.

FIG. 6 is a graph showing the relationship between the Hf/Si ratio and the Hf content in the Hf silicate film [Hf/(Hf+Si)] in the case wherein a hafnium oxide film is formed using hafnium tetramethylethylamide [Hf(N(CH$_3$)(C$_2$H$_5$)$_2$)$_4$] as a Hf material and a silicon oxide film is formed using tris(dimethylamino)silane [SiH(N(CH$_3$)$_2$)$_3$] as a Si material. Here, the HfO$_2$ film and the SiO$_2$ film were formed under different pressures in the film-forming chamber, and the pressure in HfO$_2$ film formation was 0.5 Torr and that in SiO$_2$ film formation was 5.0 Torr. The substrate temperature was 275° C.

As FIG. 6 shows, by controlling the Hf/Si ratio, that is the ratio of the number of steps for forming the HfO$_2$ film to the number of steps for forming the SiO$_2$ film in a cycle of the formation of the Hf silicate film, the Hf concentration in the Hf silicate film can be accurately controlled within a wide range of 1/30 to about 1Therefore, by using the above-described method, the peak concentration of the metal in the metal silicate film can be accurately controlled.

The method for manufacturing the semiconductor device in the first embodiment will be described.

Figure 7:
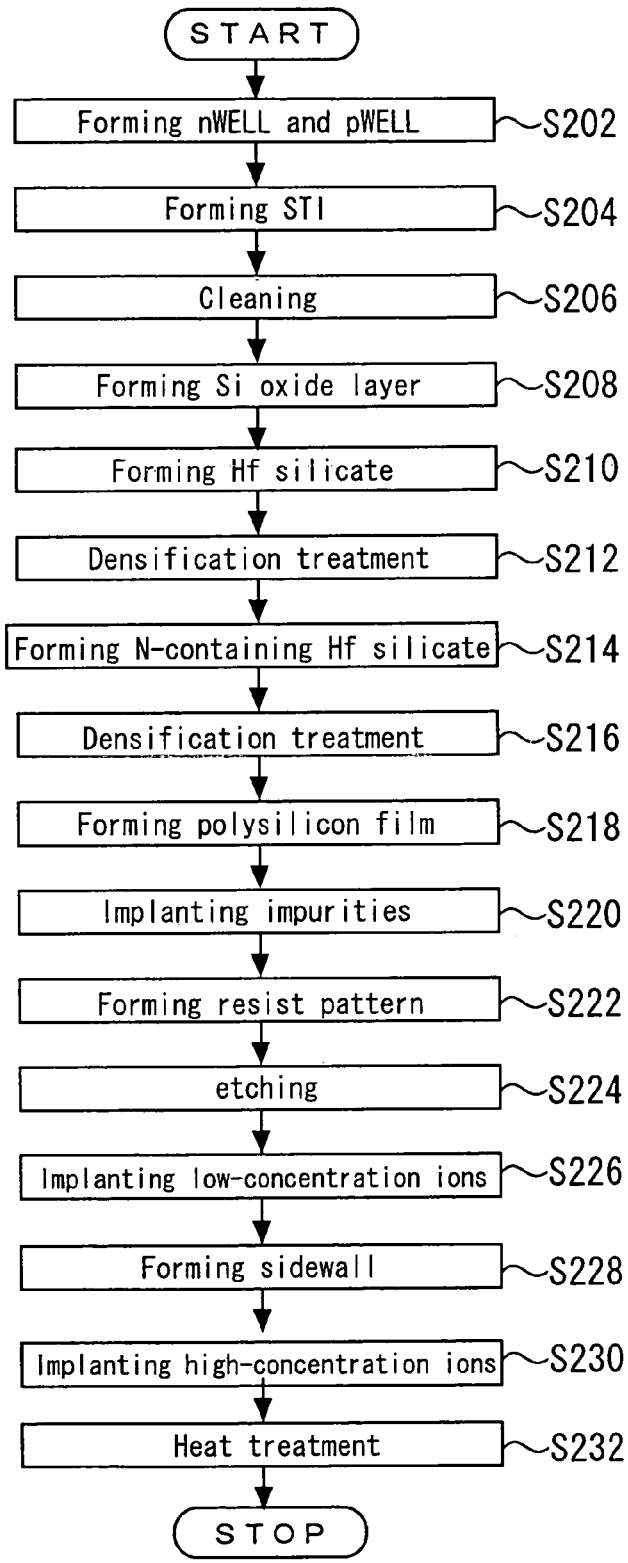
FIG. 7 is a flow diagram for illustrating the method for manufacturing a semiconductor device in the first embodiment of the present invention.

FIG. 7 is a flow diagram for illustrating the method for manufacturing a semiconductor device according to the first embodiment. FIGS. 8A to 10C are sectional views for illustrating the process for manufacturing a semiconductor device according to the first embodiment. Specifically, FIGS. 8A to 10C are sectional views for illustrating the process for manufacturing a PMOS transistor. Since an NMOS transistor has the similar cross-sectional structure to a PMOS transistor, the drawings illustrating the method for manufacturing an NMOS transistor will be omitted, and the process will be described when required.

Figure 8A:
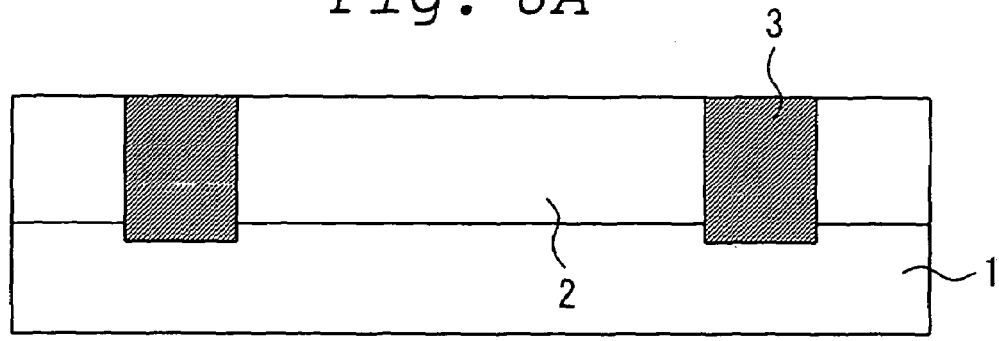

First, as FIG. 8A shows, in the PMOS transistor-forming region, an n-type impurity is introduced into a P-type silicon substrate 1, and heat treatment is carried out to form an n-type well 2. On the other hand, in the NMOS transistor-forming region, a p-type impurity is introduced into the silicon substrate 1, and heat treatment is carried out to form a p-type well.(Step S202). Then, by forming an element-isolating region 3 using the STI method, the PMOS and NMOS transistor-forming regions are partitioned (Step S204). Specifically, the element-isolating region 3 is formed by forming a shallow trench in the element-isolating region of the silicon substrate 1, and burying a silicon oxide film in the trench. The silicon oxide film formed out of the trench can be removed using the CMP method or the etch-back method.

Figure 8B:
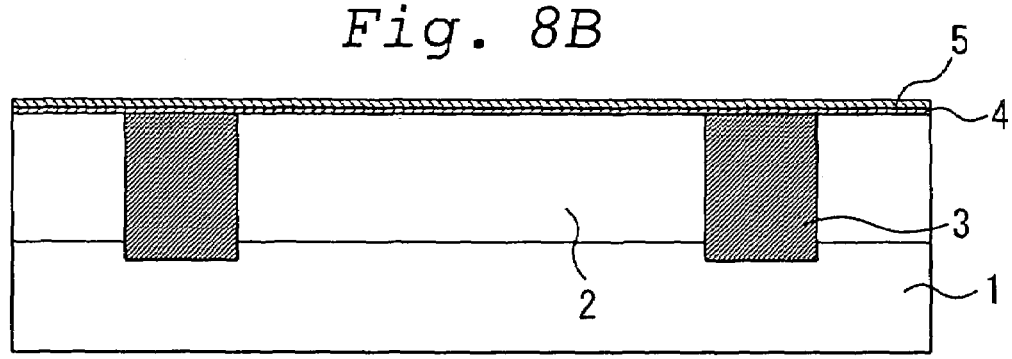

Next, the surface of the silicon substrate is cleaned using diluted hydrofluoric acid (DHF) (Step S206). Thereafter, as FIG. 8B shows, a silicon oxide film 4 of a thickness of, for example, about 0.5 nm is formed on the surface of the silicon substrate 1 by a rapid heat treatment using a halogen lamp or a flash lamp (Step S208).

After the extremely thin silicon oxide film 4 has been formed, an Hf silicate film 5 of a thickness of, for example, about 3 nm is formed using the above-described method (Step S210).

After the Hf silicate film 5 has been formed, and before a nitrogen-containing Hf silicate film 6 is formed, a treatment for the densification of the Hf silicate film 5 may be carried out (Step S212). The densification treatment can be carried out, for example, by performing rapid heat treatment using a halogen lamp in a nitrogen-gas atmosphere wherein a trace of oxygen gas is added, or in a nitrogen-gas atmosphere for 1 to 600 sec. Alternatively, the densification treatment can be carried out by performing rapid heat treatment using a flash lamp in the same atmosphere for 0.8 to 20 msec.

Figure 8C:
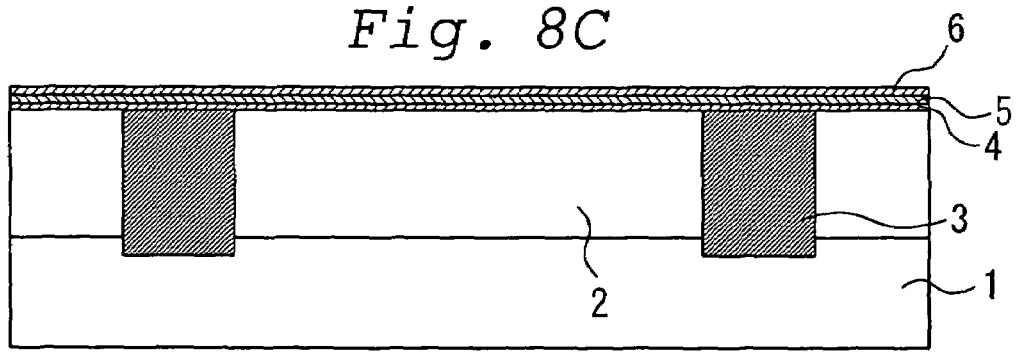

Next, as FIG. 8C shows, a nitrogen-containing Hf silicate film 6 containing Hf of a peak concentration of 1 atomic % or more and 30 atomic % or less, and nitrogen of a peak concentration of 10 atomic % or more and 30 atomic % or less is formed on the upper layer of the Hf silicate film 5 (Step S214). The nitrogen-containing Hf silicate film 6 can be formed by the plasma treatment using a nitrogen-based gas.

In place of forming the nitrogen-containing Hf silicate film 6 by nitriding the Hf silicate film 5, the nitrogen-containing Hf silicate film 6 may be formed on the Hf silicate film 5 using a material that contains hafnium, oxygen, silicon and nitrogen.

After the nitrogen-containing Hf silicate film 6 has been formed, densification treatment is carried out (Step S216). The densification treatment can be carried out, for example, by rapid heat treatment using a lamp in a nitrogen-gas atmosphere wherein a trace of oxygen gas is added, or in a nitrogen-gas atmosphere.

Figure 8D:
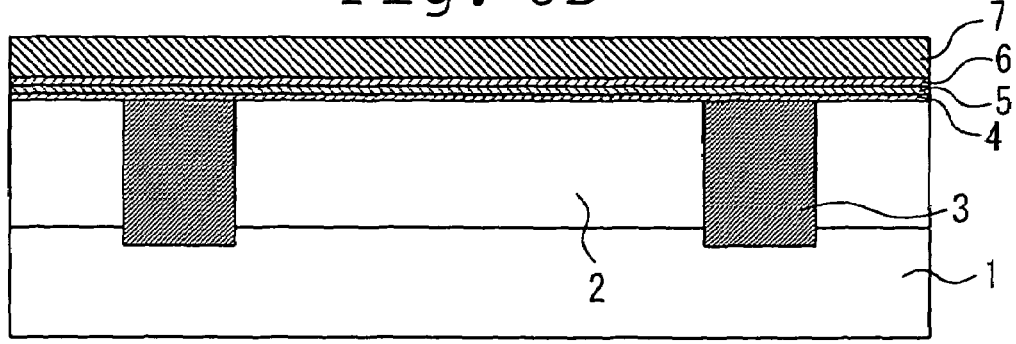

Next, as FIG. 8D shows, a polysilicon film 7 that will finally become a gate electrode is formed on the nitrogen-containing Hf silicate film 6 (Step S218).

Figure 9A:
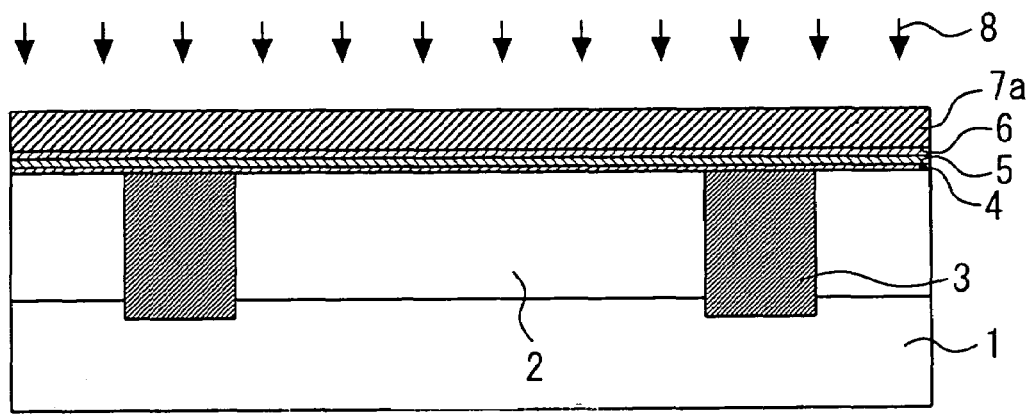

Then, as FIG. 9A shows, an impurity 8 such as boron is ion-implanted into the polysilicon film 7 (Step S220). Thereby, a doped polysilicon film 7a is formed on the nitrogen-containing Hf silicate film 6. On the other hand, although not shown in the drawings, an impurity such as phosphorus is ion-implanted into a polysilicon film formed on the NMOS transistor-forming region.

Figure 9B:
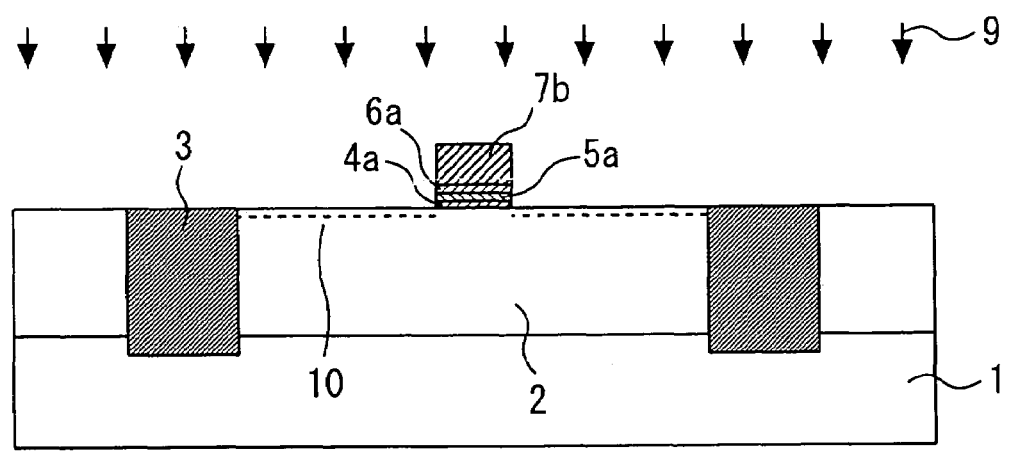

Next, a resist pattern (not shown) is formed on the doped polysilicon film 7a (Step S222), and using the resist pattern as a mask, the doped polysilicon film 7a, the nitrogen-containing Hf silicate film 6, the Hf silicate film 5, and the silicon oxide film 4 are sequentially etched (Step S224). Thereby, as FIG. 9B shows, a polysilicon gate electrode 7b is formed on the n-type well 2 of the silicon substrate 1, through the gate insulating film formed by laminating the silicon oxide film 4a, the Hf silicate film 5a, and the nitrogen-containing Hf silicate film 6a.

Then, a low concentration of boron difluoride ($BF_2$) is ion-implanted into the n-type well 2 using the gate electrode 7b as a mask. Thereby, in the n-type well 2, a p-type low-concentration ion-implanted layer 10 that will finally become an extension region is formed on the upper layer of the silicon substrate 1 on the both sides of the gate electrode 7b. On the other hand, although not shown in the drawings, in the NMOS transistor-forming region, arsenic is ion-implanted into the p-type well to form an n-type low-concentration ion-implanted layer (Step S226).

Figure 9C:
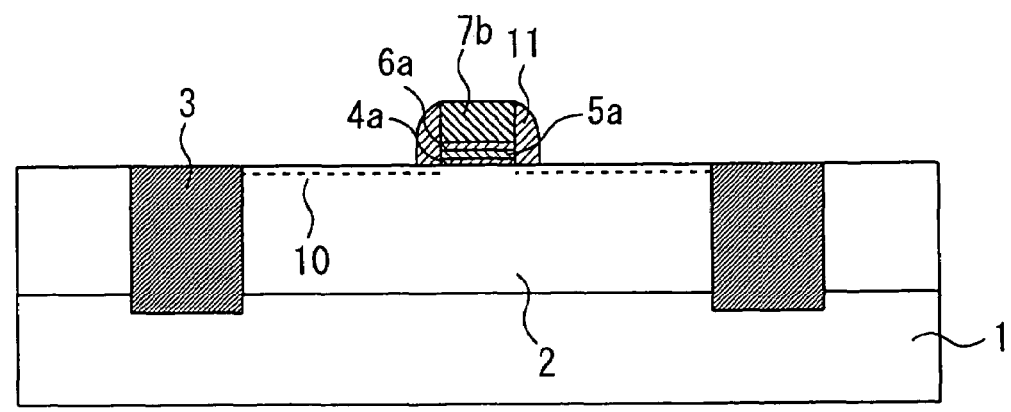

Next, a silicon nitride film having a thickness of, for example, about 100 nm is formed on the entire surface of the silicon substrate 1 so as to coat the gate electrode 7b, and the silicon nitride film is subjected to anisotropic etching. Thereby, as FIG. 9C shows, a sidewall 11 consisting of the silicon nitride film is formed in a self-aligning manner (Step S228).

Next, as FIG. 10A shows, boron 12 is ion-implanted into the n-type well 2 as a high-concentration P-type impurity 12 using the gate electrode 7b and the sidewall 11 as masks. Thereby, a p-type high-concentration ion-implanted layer 13 that will finally become the source/drain region is formed in the n-type well 2. On the other hand, although not shown in the drawings, in the NMOS transistor-forming region, phosphorus is ion-implanted into the p-type well to form an n-type high-concentration ion-implanted layer (Step S230).

Next, rapid heat treatment using a lamp is performed (Step S232). Thereby, as FIG. 10B shows, the p-type low-concentration ion-implanted layer 10 and the p-type high-concentration ion-implanted layer 13 in the n-type well 2 are activated, and the p-type extension region 14 wherein an impurity is introduced in a low concentration, and the p-type source/drain region 15 wherein an impurity is introduced in a high concentration are formed. On the other hand, although not shown in the drawings, in the NMOS transistor-forming region, the n-type low-concentration ion-implanted layer and the n-type high-concentration ion-implanted layer in the p-type well are activated, and the n-type extension region wherein an impurity is introduced in a low concentration, and the n-type source/drain region wherein an impurity is introduced in a high concentration are formed.

Here, the temperature of heat treatment for activation is preferably at least 10 degrees lower than the temperature of heat treatment for densification. For example, heat treatment for activation can be performed at 980° C., and heat treatment for densification can be performed at 1000° C. Thereby, the interaction between the gate insulating film and the gate electrode is inhibited, and the thermally stable gate insulating film wherein the diffusion of the impurity introduced into the gate electrode is inhibited can be obtained.

Next, as FIG. 10C shows, an interlayer insulating film 16 is formed on the entire surface of the substrate using the CVD method. Thereafter, a resist pattern (not shown) is formed on the insulating film 16 using a lithography techniques, contact holes connected to the source/drain region 15 are formed in the interlayer insulating film 16 by dry etching using the resist pattern as masks, and then a barrier metal film and a tungsten film are buried in the contact holes to form contacts 17. The unnecessary barrier metal film and tungsten film are removed using the CMP method. Thereafter, metal wirings 18 are formed on the contacts 17 to manufacture the semiconductor device shown in FIG. 1.

Next, the gate capacity-gate voltage characteristics (hereafter referred to as "C-V characteristics") of the MOS transistor manufactured in this embodiment will be described.

Figure 11A:
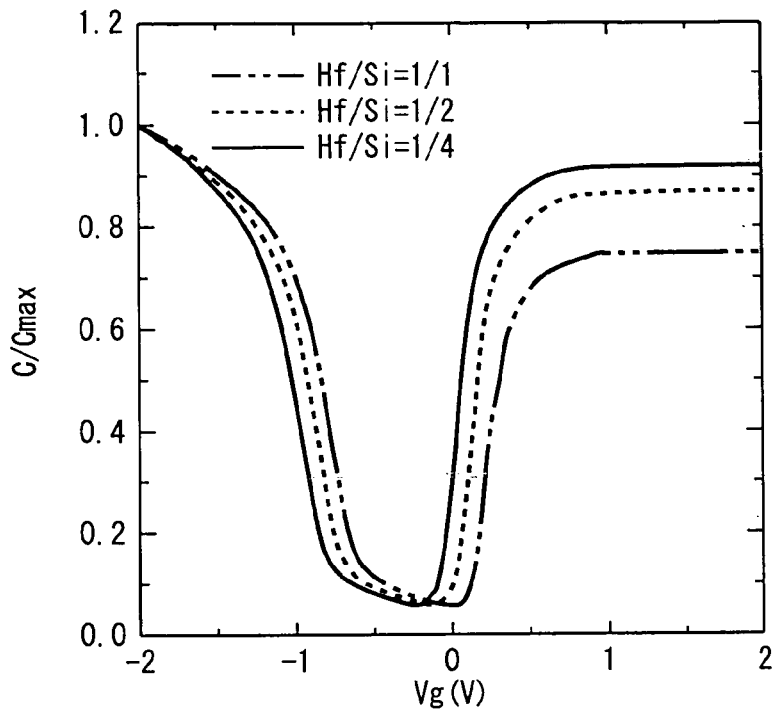
FIGS. 11A and 11B are a graphs showing the C-V characteristics of a semiconductor device in the first embodiment of the present invention.
Figure 11B:
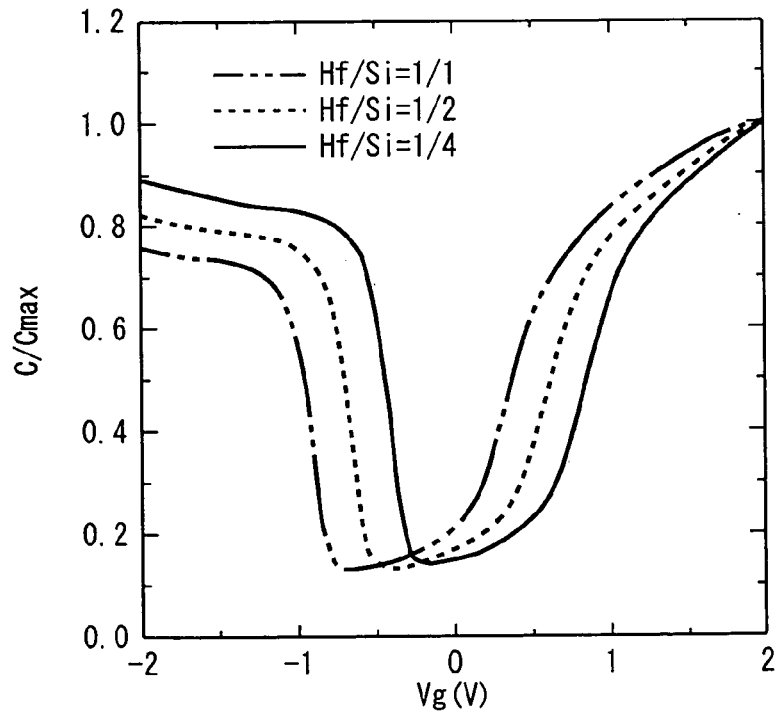

FIG. 11 is a graph showing the C-V characteristics of a semiconductor device according to the first embodiment. Specifically, FIG. 1A is a graph showing the C-V characteristics of an NMOS transistor; and FIG. 11B is a graph showing the C-V characteristics of a PMOS transistor.

As FIGS. 11A and 11B show, when an Hf silicate film is formed in Hf/Si=1/1 (above described), the C-V characteristics of an actually obtained MOS transistor are deviated from ideal C-V characteristics. This is because the initial Vfb shift is not inhibited.

On the other hand, when an Hf silicate film is formed in Hf/Si=1/2, the C-V characteristics are close to ideal C-V characteristics.

Furthermore, when an Hf silicate film is formed in Hf/Si=1/4, that is, when the metal concentration [hf/(Hf+Si)] is about 30% or less, substantially ideal C-V characteristics can be obtained. Therefore, it is understood that the initial Vfb is sufficiently inhibited.

Thus, better C-V characteristics could be obtained by forming a silicon-rich Hf silicate film, and a substantially ideal C-V curve was obtained when the metal concentration was about 30% or less. Especially, as FIG. 11B shows, marked improvement of C-V characteristics was achieved in the PMOS transistor.

In addition, as FIGS. 11A and 11B show, it is known that the C/Cmax value varies depending on the Hf/Si ratio in the reverse side, and with increase in the concentration of silicon, the C/Cmax value increases. This is considered because as the concentration of silicon in the Hf silicate film increases, the diffusion of impurities from the upper electrode polysilicon decreases, and depletion is minimized.

The same results can also be obtained in the case of the Hf silicate formation using the above-described other Hf materials or Si materials.

According to this embodiment, as described above, the peak concentration of the metal in the nitrogen-containing Hf silicate film 6a positioned on the uppermost layer of the gate insulating film was controlled to 1 atomic % or more and 30 atomic % or less. Thereby, the initial Vfb shift could be sufficiently inhibited, and C-V characteristics equivalent to ideal C-V characteristics could be obtained.

Further, the peak concentration of nitrogen in the nitrogen-containing Hf silicate film 6a was controlled to 10 atomic % or more and 30 atomic % or less. Thereby, the diffusion of impurities introduced into the gate electrode in the activating heat treatment could be inhibited, and the Vfb shift due to the diffusion of impurities could be inhibited.

In the first embodiment, the case of using a metal silicate film as the high-dielectric-constant film 5, and using a nitrogen-containing metal silicate film as the upper layer insulating film 6 was described. However, for example, the present invention can be applied to the case of using a metal aluminate film as the high-dielectric-constant film, and using a nitrogen-containing metal aluminate film as the upper layer insulating film, and the similar results can also be obtained from this case.

Next, the modification on the first embodiment will be described.

In the above-described embodiment, the peak concentration of the metal was equivalent in the metal silicate film 5a and in the nitrogen-containing metal silicate film 6a. In this modification, however, the peak concentration of the metal in the metal silicate film 5a was higher than that in the nitrogen-containing metal silicate film 6a. In other words, the metal silicate film 5a was made to be a metal-rich film; and the nitrogen-containing metal silicate film 6a was made to be a silicon-rich film. Since other constitution is the same as in the above-described embodiment, the description thereof will be omitted.

In this modification, a metal silicate film (e.g., Hf silicate film or Zr silicate film) as the high-dielectric-constant film 5a was made to be a metal-rich film that contains a metal in the peak concentration of 5 atomic % or more and 40 atomic % or less.

In the method for manufacturing a semiconductor device according to the above-described embodiment, after a silicon oxide film 4 has been formed, for example, a hafnium-rich Hf silicate film is formed in the ratio of Hf/Si=1/2. On the Hf silicate film, a silicon-rich Hf silicate film is formed in the ratio of Hf/Si=1/4. Thereafter, the silicon-rich Hf silicate film is nitrided to form a silicon-rich nitrogen-containing Hf silicate film as the upper layer insulating film. Thereafter, in the same manner as in the above-described embodiment, a polysilicon film 7 is formed on the nitrogen-containing Hf silicate film.

In this modification, by making the film on the uppermost layer of the gate insulating film a nitrogen-containing metal silicate film that contains the metal in the peak concentration of 1 atomic % or more and 30 atomic % or less, the similar effect as in the above-described embodiment can also be obtained. Furthermore, this modification can improve the total effective specific dielectric constant of the gate insulating film by the use of a metal-rich metal silicate film as the high-dielectric-constant film 5a.

Second Embodiment

The semiconductor device and the method for the manufacture thereof according to the second embodiment is the same as those described in the first embodiment. In the second embodiment, however, a different method is used to form a metal silicate such as an Hf silicate.

This will be described below in detail.

Figure 12:
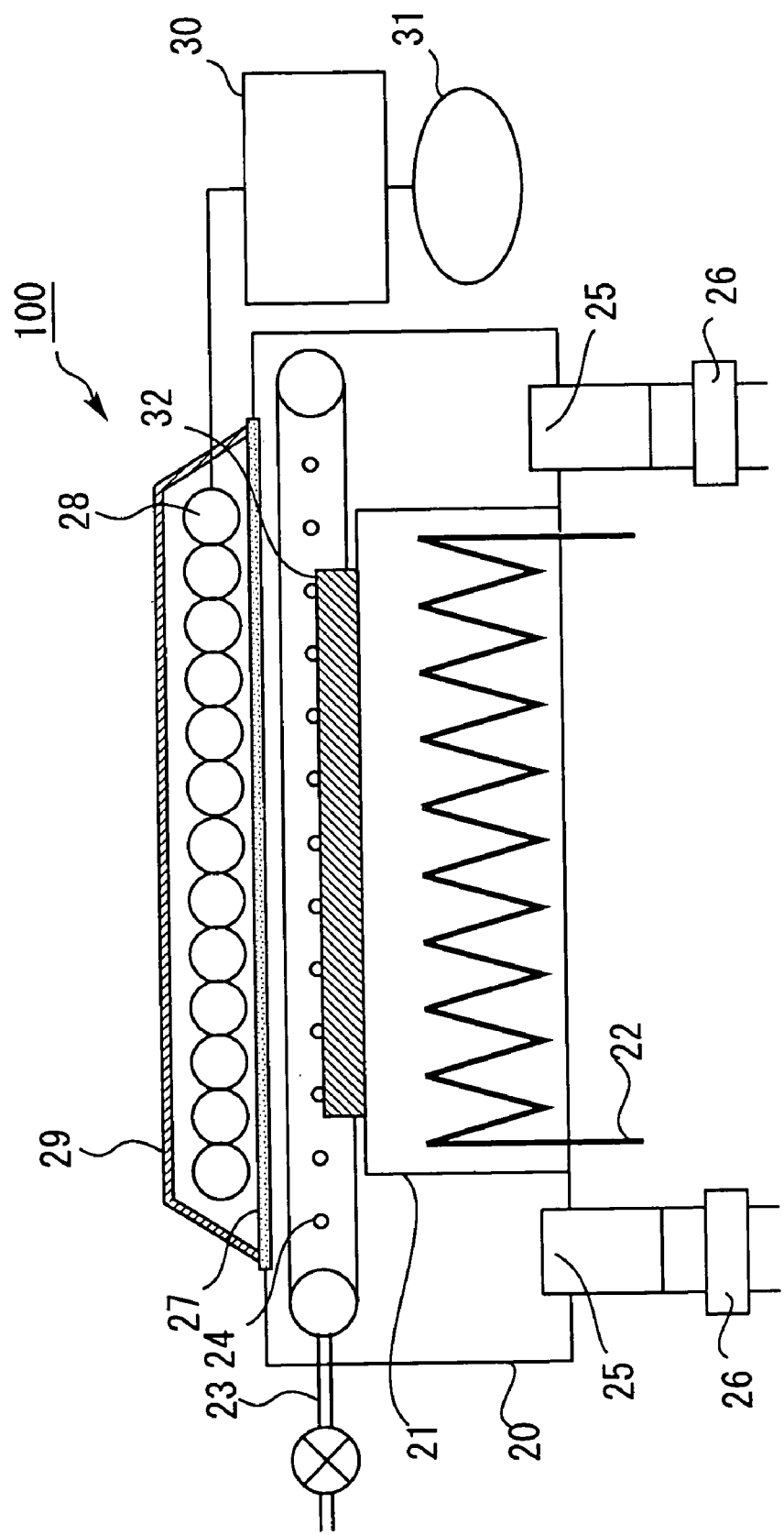
FIG. 12 is a schematic diagram for illustrating a thin film forming apparatus in the second embodiment of the present invention.

FIG. 12 is a schematic diagram for illustrating a thin film forming apparatus in the second embodiment of the present invention.

As FIG. 12 shows, the thin film forming apparatus 100 is equipped with a vacuum chamber 20.

On the central portion in the chamber 20, a table 21 is disposed. In the table 21, a heater 22 is installed to heat the table from the bottom thereof to a predetermined temperature.

Above the table 21, a gas supply pipe 23 is installed so as to pass through a portion of the outer wall of the chamber 20. In other words, the gas supply pipe 23 passes from the outside of the chamber 20 to the inside of the chamber 20, and thereby supplies the gas into the chamber 20. The gas supply pipe 23 is also disposed so as to surround upside of the table 21. The gas supply pipe 23 has a plurality of ejection nozzles 24. The gas supplied from the gas supply pipe 23 is ejected through these ejection nozzles 24 into the chamber 20.

A total of two gas discharge ports 25 are installed so as to pass through the underside of the outer wall of the chamber 20. The gas discharge ports 25 run from the inside to the outside of the chamber 20, and are connected to a vacuum pump through a valve 26. Thereby the gas in the chamber 20 can be discharged to the exterior.

The ceiling portion of the chamber 20, facing the table 21, is formed of a quartz window 27. In the upper portion of the quartz window 27, a total of 50 flash lamps 28 are disposed, and the flash lamps 28 are covered with a reflective plate 29. The flash lamps 28 are connected to a capacitor 30, and the capacitor 30 is connected to a power source 31.

In the thin film forming apparatus 100, the ceiling portion of the chamber 20 is formed of a quartz window 27 that permeates light so as to introduce light emitted from the flash lamps 28. The reflective plate 29 is installed so as to reflect the light emitted from the flash lamps 28 toward the opposite side to the chamber 20 (upward in FIG. 12) to the chamber 20, and to introduce the light into the chamber 20. The current from the power source 31 is charged into the capacitor 30, and instant discharge of the electric charge makes the flash lamp 28 emit light.

In the second embodiment, a metal silicate is formed using the thin film forming apparatus 100 constituted as described above, in place of the steps S102 to S110 (S210) in the manufacturing process of the semiconductor device described in the first embodiment. In this case a substrate 32 is placed on the table 21.

Figure 13:
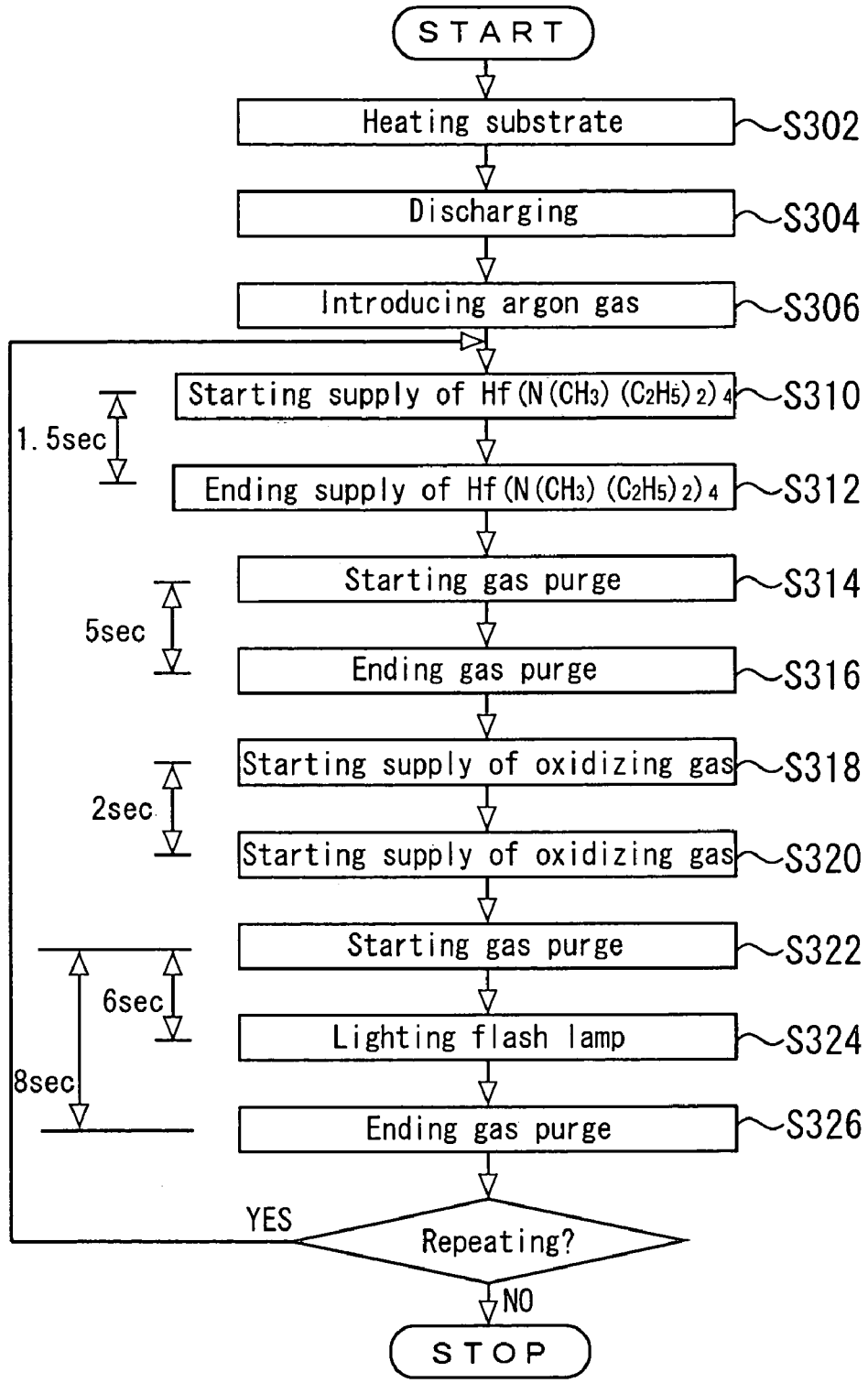
FIG. 13 is a flow diagram for illustrating the method for forming a metal silicate film in the second embodiment of the present invention.
Figure 14:
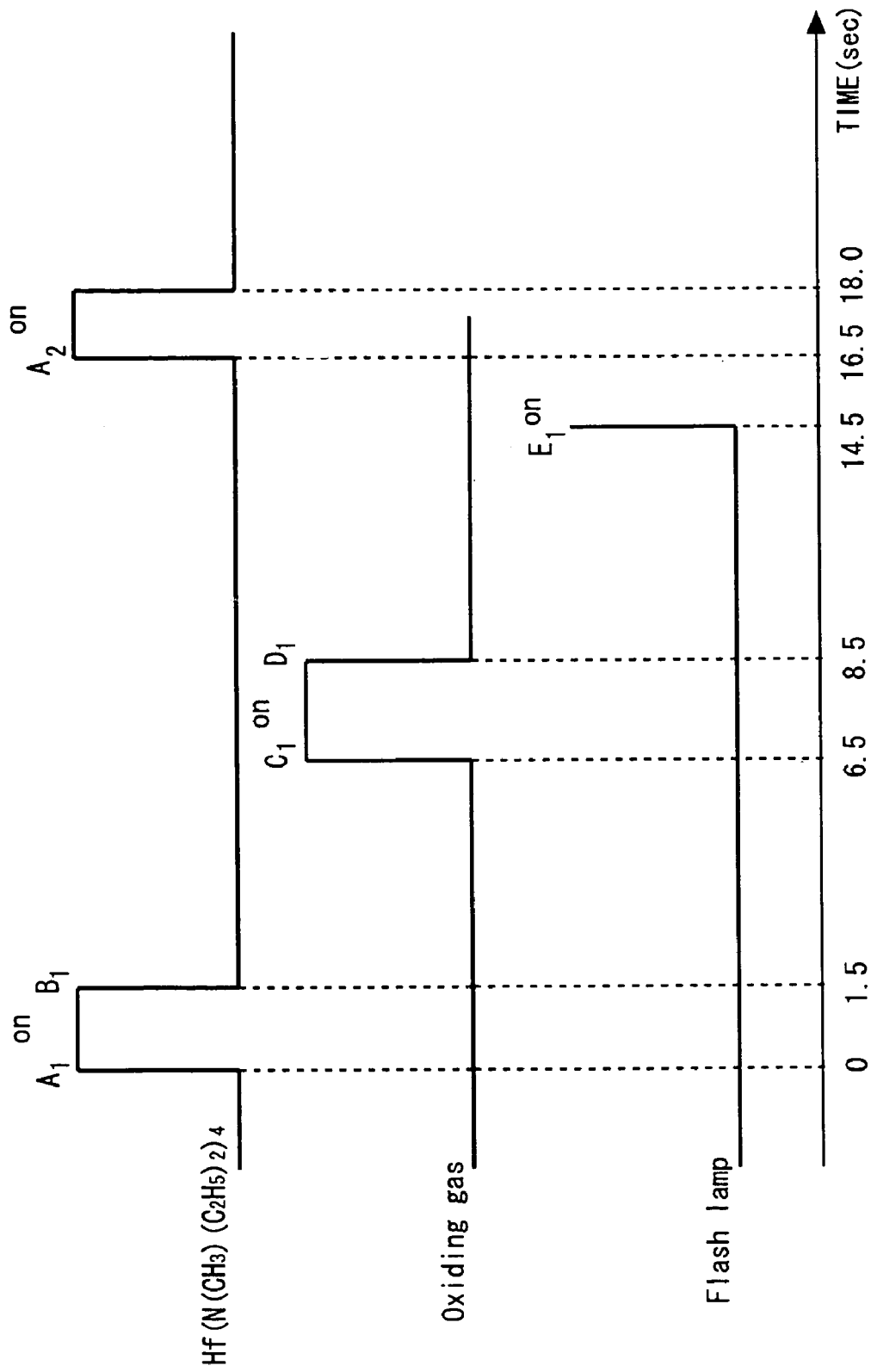
FIG. 14 is a graph for illustrating the sequence in the method for forming a metal silicate film in the second embodiment.

FIG. 13 is a flow diagram for illustrating the method for forming a metal silicate film in the second embodiment of the present invention; and FIG. 14 is a graph for illustrating the sequence in the method for forming a metal silicate film in the second embodiment.

In the second embodiment, the metal silicate film is also formed by individually forming a hafnium oxide film and a silicon oxide film. This will be specifically described referring to FIGS. 12 to 14.

First, a hafnium oxide film is formed.

Here, first, the table 21 is heated in the state where a substrate 32 is placed on the table 21 (Step S302). Here, the table 21 is heated using the heater 22 to a temperature of 300° C. Thereby, the temperature of the substrate 32 is maintained at 300° C. Next, the gas in the chamber 20 is discharged (Step S304). Gas discharge is performed by opening the valve 26 and sucking the gas through the gas discharge ports 25 using the vacuum pump until the pressure in the chamber 20 becomes $10^{-7}$ Torr. Thereafter, argon gas is supplied into the chamber 20 (Step S306). The argon gas is supplied through the gas supply pipe 23, and is ejected through the ejection nozzles 24 into the chamber 20. The pressure in the chamber 20 is fixed to 0.5 Torr.

After the chamber 20 has been maintained in this state, the introduction of the material gas is started.

Referring to FIG. 14, the supply of hafnium tetramethylethylamide is started at the point $A_1$ (Step S310). Hafnium tetramethylethylamide is supplied through the gas supply pipe 23, and is ejected through the ejection nozzles 24 into the chamber 20. The supply of hafnium tetramethylethylamide is performed at 2 sccm, for 1.5 seconds, and the supply is stopped at the point $B_1$ 1.5 seconds later (Step S312).

Thereafter, the purge of the gas in the chamber 20 is started (Step S314). Here, argon gas is supplied through the gas supply pipe 23 for about 5 seconds. On the other hand, the valve 26 is opened and the gas in the chamber 20 is discharged through the gas discharge ports 25 with the vacuum pump. The supply of argon gas and gas discharge are stopped at the point $C_1$ 5 seconds later (Step S316). At this time, the valve 26 is closed.

Thereafter, the supply of ozone gas is started (Step S318). In the same manner as hafnium tetramethylethylamide, ozone gas is also supplied through the gas supply pipe 23, and is ejected through the ejection nozzles 24 into the chamber 20. The supply of ozone gas is performed at 5 sccm for 2 seconds, and the supply is stopped at the point $D_1$ 2 seconds later (Step S320).

Thereafter, the discharge of the gas from the chamber 20 is started (Step S322). In the same manner as the discharge performed after the supply of hafnium tetramethylethylamide, the gas is purged by supplying argon gas through the gas supply pipe 23, and simultaneously the valve 26 is opened to discharge the gas through the gas discharge ports 25 using the vacuum pump.

At the point $E_1$, 6 seconds after gas purge was started, the light emitting of the flash lamps 28 is performed (Step S324). The energy of the light-emitting flash lamps 28 is 15 J/cm². The light emitting time of the flash lamps 28 is as an extremely short time such as about 5.0 to 20 msec, and thereby only the surface of the substrate 32 is heated instantly.

At the point $A_2$, 8 seconds after gas purge was started, the supply of argon gas and the discharge of the gas from the chamber 20 are stopped (Step S326). Thereafter, the introduction of hafnium tetramethylethylamide is started again (Step S310), and steps S310 to S326 are repeated.

Thus, the introduction of hafnium tetramethylethylamide (Steps S310 and S312), the purge of the gas (Steps S314 and S316), the introduction of ozone gas (Steps S318 and S320), the purge of the (Steps S322 and S326), and the light emitting of the flash lamps during the purge of the gas (Step S324) are repeated for 20 times, and the formation of the thin film is completed. Thereby, a hafnium oxide film of a thickness of about 2.5 nm can be formed on the substrate 32.

Next, in the same manner, a silicon oxide film is formed.

First, the table 21 is maintained at about 300° C. in the same manner as in the formation of the hafnium oxide film. The chamber 20 is purged with argon gas, and the pressure in the chamber 20 is fixed to 5.0 Torr.

After the chamber 20 is maintained in this state, the introduction of the material gas is started.

Referring again to FIG. 14, the supply of trisdimethylaminosilane as the Si material is started at the point $A_1$ (Step S330). Trisdimethylaminosilane is supplied through the gas supply pipe 23, and is ejected through the ejection nozzles 24 into the chamber 20. The supply of trisdimethylaminosilane is performed at 2 sccm for 1.5 seconds, and the supply is stopped at the point $B_1$ 1.5 seconds later (Step S332).

Thereafter, the purge of the gas in the chamber 20 is started (Step S334). Here, argon gas is supplied through the gas supply pipe 23 for about 5 seconds, and on the other hand, the valve 26 is opened. The gas in the chamber 20 is discharged through the gas discharge ports 25 with the vacuum pump, and the purge of the gas is stopped at the point $C_1$ 5 seconds later (Step S336).

Thereafter, the supply of ozone gas is started (Step S338). In the same manner as trisdimethylaminosilane, ozone gas is also supplied through the gas supply pipe 23, and is ejected through the ejection nozzles 24 into the chamber 20. The supply of ozone gas is performed at 5 sccm for 2 seconds, and the supply is stopped at the point $D_1$ 2 seconds later (Step S340).

Thereafter, the discharge of the gas from the chamber 20 is started (Step S342). In the same manner as the discharge performed after the supply of trisdimethylaminosilane, the gas is purged by supplying argon gas through the gas supply pipe 23, and simultaneously the valve 26 is opened to discharge the gas through the gas discharge ports 25 using the vacuum pump.

At the point $E_1$, 6 seconds after the purge of the gas was started, the light emitting of the flash lamps 28 is performed (Step S344). The energy of the light-emitting flash lamps 28 is 15 J/cm². The light-emitting time of the flash lamps 28 is as an extremely short time such as about 5.0 to 20 msec, and thereby only the surface of the substrate 32 is heated instantly.

At the point $A_2$, 8 seconds after the purge of the gas was started, the purge of the gas in the chamber 20 is stopped (Step S346). Thereafter, the introduction of trisdimethylaminosilane is started again (Step S330), and steps S330 to S346 are repeated.

Thus, the introduction of trisdimethylaminosilane (Steps S330 and S332), the purge of the gas (Steps S334 and S336), the introduction of ozone gas (Steps S338 and S340), the purge of the gas (Steps S342 and S346), and the light emitting of the flash lamps 28 during the purge of the gas (Step S344) are repeated for 5 times, and the formation of the thin film is completed. Thereby, a silicon oxide film of a thickness of about 0.4 nm can be formed on the substrate 32.

Thereafter, the steps S212 to S232 described in the first embodiment is carried out to form a semiconductor device according to the second embodiment.

Here, the formed hafnium oxide film in the second embodiment was compared with an aluminum oxide film formed according to a conventional method, wherein the sequence of the supply of the material gas and the purge of the gas is performed in the same manner, but without heating with the flash lamps 28, using a secondary ion mass spectrometer, and it was found that the quantity of residual carbon in the thin film was lowered to about 1/10.

This is considered that since heating of the millisecond order can be performed by heating by flash lamps, the temperature of the surface of the substrate 32 can be raised instantly to accelerate the reaction, and the temperature of the substrate 32 can be immediately lowered to the original temperature.

Whereas, in the case of using the conventional ALD method, after supplying the material gas, an oxidizing gas such as ozone gas is supplied to start oxidation reaction. However, at this time, since the temperature of the wafer is low, and the reaction time is not sufficiently long, the oxidation reaction is not completed. This is considered to be the cause of residual impurities in the film.

In the ALD method, however, since the reaction rate of the film is low, the reaction time cannot be made sufficiently long when productivity is considered.

Since chemical kinetics teaches that the reaction rate is the exponential function of temperature, it is considered to raise temperature to increase the reaction rate. However, in an apparatus used for the conventional ALD method, it is considered that if the temperature of a wafer is simply raised, decomposition begins only by supplying the material gas. For example, if hafnium tetramethylethylamide is supplied at a high substrate temperature, the hafnium tetramethylethylamide is decomposed by itself, and a carbon-containing hafnium film is formed. Therefore, temperature cannot be raised in the conventional ALD.

On the other hand, according to the formation of a metal silicate film in the above-described embodiment, the flash lamps 28 can heat the surface of a wafer for the millisecond order and can raise the surface temperature of the wafer instantly to accelerate the rate of reaction. Also since only the surface of the substrate 32 is heated for an extremely short time, the wafer temperature can be immediately returned to the original temperature. Therefore, the next cycle (Steps S310 to S324) can be performed at the original wafer temperature. Thereby, a high-dielectric-constant thin film having a low impurity concentration and good characteristics can be formed.

In the second embodiment, the case wherein a thin film forming apparatus 100 is used for forming the metal silicate film of a semiconductor device was described. However, the present invention is not limited thereto, but the thin film forming apparatus 100 can be applied to the formation of other thin films.

In the second embodiment, the case wherein 50 flash lamps 28 are used was described; however, the thin film forming apparatus of the present invention is not limited to the apparatus using. 50 flash lamps. Further in this embodiment, flash lamps 28 are used as the heating means. However, the heating means in the present invention is not limited to the flash lamps, but other means can be used as long as the surface of the substrate can be adequately heated.

Also in the second embodiment, the case wherein the heating time by the flash lamps is 5.0 to 20 milliseconds was described. However, the heating time in the present invention is not limited to this range. However, when the lowering of the impurity concentration contained in the high-dielectric-constant film is considered, it is considered that the heating time is preferably 0.8 milliseconds or longer.

In this embodiment, the upper portion of the chamber 20 was made to be a quartz window 27, through which light from the flash lamps 28 was transmitted to irradiate the substrate in the chamber 20. Furthermore, the case wherein a reflective plate 29 is installed above the flash lamps 28 so as to reflect light emitted upward and irradiate the chamber 20 was described. However, the constitution of the thin film forming apparatus according to the present invention is not limited thereto, but other constitution, for example, the constitution wherein the flash lamps 28 are directly installed in the chamber 20, can be used.

Further in this embodiment, the case wherein ejecting nozzles 24 are installed in the gas supply pipe 23, and a vacuum pump is installed in the gas discharge ports 25 through a valve 26 to discharge the gas was described. However, the thin film forming apparatus of the present invention is not limited to the apparatus having such a constitution, but other constitutions can be used as long as the gas can be supplied into the chamber 20, and the gas can be adequately-discharged from the chamber 20.

The other constitutions of the thin film forming apparatus of the present invention are not limited to the constitution described in this embodiment, but other constitutions can be used as long as the surface of the substrate can be adequately heated, and the reaction can be accelerated.

Furthermore, since the description of the material gas and the like to be used in the second embodiment is the same as those described in the first embodiment, the description thereof was omitted.

The features and the advantages of the present invention as described above may be summarized as follows.

According to one aspect of the present invention, in a semiconductor device, the metal content in the metal silicate film formed on the uppermost layer of a high-dielectric-constant film is controlled. Accordingly, the semiconductor device having C-V characteristics equivalent to ideal C-V characteristics can be realized.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-434367, filed on Dec. 26, 2003 including specification, claims, drawings and summary, on which the Convention priority of the present application is based, are incorporated herein by reference in its entirety.

The invention claimed is:

1. A method of manufacturing a semiconductor device comprising:
    forming a base interface layer on a substrate;
    forming a metal silicate film containing a metal in a peak concentration in a range from one atomic % to thirty atomic % on said base interface layer;
    forming a nitrogen-containing metal silicate film containing nitrogen in a peak concentration in a range from ten atomic % to thirty atomic % on said metal silicate film; and
    forming a gate electrode on said nitrogen-containing metal silicate film, wherein forming said metal silicate film includes, repeatedly:
        forming a metal oxide film by supplying a metal-containing material, and then supplying an oxygen-based gas, to said substrate;
        forming a silicon oxide film by supplying a silicon-containing material, and then supplying an oxygen-based gas, to said substrate; and
        controlling the number of cycles of forming said metal oxide film and forming said silicon oxide film.

2. The method of manufacturing a semiconductor device according to claim 1, including repeatedly forming said metal oxide film by:
    supplying said metal-containing material to said substrate;
    supplying said oxygen-based gas to said substrate; and
    radiating the surface of said substrate with light for up to several milliseconds.

3. The method of manufacturing a semiconductor device according to claim 1, including repeatedly forming said silicon oxide film by:
    supplying said silicon-containing material to said substrate;
    supplying said oxygen-based gas to said substrate; and
    radiating the surface of said substrate with light for up to several milliseconds.

4. A method of manufacturing a semiconductor device comprising:
    forming a base interface layer on a substrate;
    forming a metal silicate film containing a metal in a peak concentration in a range from five atomic % to forty atomic % on said base interface layer;

forming a nitrogen-containing metal silicate film containing a metal in a peak concentration in a range from one atomic % to thirty atomic % and nitrogen in a peak concentration in a range from ten atomic % to thirty atomic % on said metal silicate film; and forming a gate electrode on said nitrogen-containing metal silicate film, wherein forming said metal silicate film includes, repeatedly:

forming a metal oxide film by supplying a metal-containing material, and then supplying an oxygen-based gas, to said substrate;

forming a silicon oxide film by supplying a silicon-containing material, and then supplying an oxygen-based gas, to said substrate; and controlling the number of cycles of forming said metal oxide film and forming said silicon oxide film.

5. The method of manufacturing a semiconductor device according to claim 4, including repeatedly forming said metal oxide film by:

supplying said metal-containing material to said substrate;

supplying said oxygen-based gas to said substrate; and radiating the surface of said substrate with light for up to several milliseconds.

6. The method of manufacturing a semiconductor device according to claim 4, including repeatedly forming said silicon oxide film by:

supplying said silicon-containing material to said substrate;

supplying said oxygen-based gas to said substrate; and radiating the surface of said substrate with light for up to several milliseconds.

7. A method of manufacturing a semiconductor device comprising:

forming a base interface layer on a substrate;

forming a metal silicate film containing a metal in a peak concentration in a range from five atomic % to forty atomic % on said base interface layer;

forming a nitrogen-containing metal silicate film containing a metal in a peak concentration in a range from one atomic % to thirty atomic % and nitrogen in a peak concentration in a range from ten atomic % to thirty atomic % on said metal silicate film; and forming a gate electrode on said nitrogen-containing metal silicate film, wherein forming said nitrogen-containing metal silicate film comprises:

forming a base metal silicate film containing a metal in a peak concentration in a range from one atomic % to thirty atomic %; and introducing nitrogen into said base metal silicate film in a peak concentration in a range from ten atomic % to thirty atomic % by nitriding said metal silicate film.

8. The method of manufacturing a semiconductor device according to claim 7, wherein forming a base metal silicate film includes:

forming a metal oxide film by supplying a metal-containing material, and then supplying an oxygen-based gas, to said substrate; and forming a silicon oxide film by supplying a silicon-containing material, and then supplying an oxygen-based gas, to said substrate; and controlling the number of cycles of forming said metal oxide film and forming said silicon oxide film to form said metal silicate film.

9. The method of manufacturing a semiconductor device according to claim 8, including repeatedly forming said metal oxide film by:

supplying said metal-containing material to said substrate;

supplying said oxygen-based gas to said substrate; and radiating the surface of said substrate with light for up to several milliseconds.

10. The method of manufacturing a semiconductor device according to claim 8, including repeatedly forming said silicon oxide film by:

supplying said silicon-containing material to said substrate;

supplying said oxygen-based gas to said substrate; and radiating the surface of said substrate with light for up to several milliseconds.

11. A method of forming a high-dielectric-constant film on a substrate comprising sequentially:

supplying a first source gas that contains at least one element of elements constituting a high-dielectric-constant film into a housing where a substrate is located;

after stopping supplying of the first source gas, supplying a second source gas into the housing, the second source gas reacting with said first source gas and forming the high-dielectric-constant film; and after stopping supplying of the second source gas, heating the surface of the substrate by radiating the surface of the substrate with light for up to several milliseconds.

12. The method for forming a high-dielectric-constant film according to claim 11, including radiating the substrate with light for a time in a range of 0.8 to 20 miliseconds.

* * * * *